United States Patent [19]
Blümel et al.

[11] Patent Number: 5,285,345
[45] Date of Patent: Feb. 8, 1994

[54] MODULATOR SWITCHING SYSTEM HAVING AT LEAST ONE SEMICONDUCTOR SWITCH FOR ADAPTATION TO DIFFERENT LOAD RANGES AND PROTECTION THRESHOLDS

[75] Inventors: Thomas Blümel, Schmitten; Joachim Meicher, Hofheim; Bernhard Lukas, Raunheim; Walter Kares, Frankfurt, all of Fed. Rep. of Germany

[73] Assignee: VDO Adolf Schindling AG, Frankfurt am Main, Fed. Rep. of Germany

[21] Appl. No.: 785,528

[22] Filed: Oct. 31, 1991

[30] Foreign Application Priority Data

Oct. 31, 1990 [DE] Fed. Rep. of Germany ....... 4034571

[51] Int. Cl.⁵ .............................................. H02P 9/00
[52] U.S. Cl. ..................................... 361/98; 307/270; 123/490; 361/103
[58] Field of Search ................. 361/98, 103; 307/270; 323/285; 123/490

[56] References Cited

U.S. PATENT DOCUMENTS

| | | | |
|---|---|---|---|
| 4,355,277 | 10/1982 | Davis et al. | 323/351 |
| 4,707,620 | 11/1987 | Sullivan et al. | 307/270 |
| 4,736,267 | 4/1988 | Karlmann et al. | 361/101 |
| 4,750,079 | 6/1988 | Fay et al. | 361/101 |
| 4,787,007 | 11/1988 | Matsumura et al. | 361/98 |
| 4,831,483 | 5/1989 | Matsumura et al. | 361/98 |
| 4,835,669 | 5/1989 | Hancock et al. | 363/21 |
| 5,053,911 | 10/1991 | Kopel et al. | 361/154 |
| 5,189,589 | 2/1993 | Marshall | 361/93 |

FOREIGN PATENT DOCUMENTS 61-112424 5/1986 Japan .

OTHER PUBLICATIONS

Electronic Band 34, NR, 10, 13; May 1988, pp. 89–92, 95, 96, 98, München, Germany, M. Lee.
Electronic Band 39, NR. 6, 16; Mar. 1990, pp. 92–97, München, Germany, E. Haberotte, et al.
PESC 88 Record-19th Annual IEEE Power Electr. Specialist Conf. Band 2, Apr. 11–14, 1988, pp. 1319–1329.
EDN-Electr. Design News Band 33, NR 7, 31, Mar. 1988, pp. 113–129, 122, 124, 126, Newton, Mass., D. Pryce "Smart-power".

Primary Examiner—William H. Beha, Jr.
Attorney, Agent, or Firm—Martin A. Farber

[57] ABSTRACT

A modular switching system includes a transistor operative in a switching mode for applying current to a load. Adaptation of the system to accommodate different values of load is attained by coupling an input drive signal to a base terminal of the transistor via a variable gain amplifier wherein the gain is established by a load-adaption signal to meet the requisite base current drive signal for the load. Plural emitter terminals of the transistor connected to separate branches of a monitoring circuit, each branch having its own threshold detector, for monitoring of minimum and maximum values of load current.

14 Claims, 2 Drawing Sheets

MODULATOR SWITCHING SYSTEM HAVING AT LEAST ONE SEMICONDUCTOR SWITCH FOR ADAPTATION TO DIFFERENT LOAD RANGES AND PROTECTION THRESHOLDS

FIELD AND BACKGROUND OF THE INVENTION

The present invention relates to an electric circuit, developed as a module, and having at least one semiconductor switch for switching a load, in particular for switching a setting member in automotive engine control or automatic control devices.

Control or automatic control devices are frequently formed of individual modules which are generally developed as integrated circuits. For this purpose, so-called driver modules are known which contain one or more output stages for the switching of loads. In electronic systems for motor vehicles such driver modules are used, for instance, for switching injection valves, for tank regeneration and for exhaust-gas recycling.

The specific loads to be switched, however, have different properties, particularly with regard to their resistance, and therefore their power requirement, and their inductance. For optimal cooperation between a specific driver module and the different loads, it has been necessary, therefore, to use driver modules of different design. This increases the expense of the control and automatic control devices since the individual types of driver modules are manufactured in smaller quantities and the logistics of supply become more difficult in the presence of a greater diversity of types.

SUMMARY OF THE INVENTION

It is an object of the circuit arrangement of the invention to make it possible to use a single driver module for several load ranges.

According to the invention, a switching input (34) to the module is provided and the circuit is adapted to different, preferably two different, load ranges as a function of a switching voltage which is to be fed to the switching input (34).

A further development of the invention is that the amplitude of a control signal which can be fed to the control electrode of a semiconductor switch (2) is dependent on the switching voltage. In this way it is made possible that a sufficiently large base current for controlling the semiconductor switch, which is developed as a transistor, is available in an upper load range in order definitely to switch the transistor, and to insure that an unnecessarily high base current does not flow within a lower load range. By the latter measure the power consumption in the lower load range is reduced to the amount necessary.

For safety and error-diagnosis purposes, monitoring circuits can be integrated in the driver module. Thus, for instance, short-circuit or no-load error reports are given at different threshold values for the current through the semiconductor switch. The threshold values lie in this connection outside the current range for correct operation, in which connection tolerances and changes in time as well as temperature of the load are to be taken into account. However, the threshold values should not be too far from the limits of this current range in order that abnormal operating conditions which still do not represent a complete short circuit or no-load are also indicated.

In order to be able to give reliable error reports, it is provided therefore, in accordance with another feature of the invention, that threshold values at which a short-circuit monitoring circuit (21-26) and a no-load monitoring circuit (13-19) respond are dependent on the switching voltage.

In order to protect the semiconductor switch from overvoltage upon the switching of inductive loads, a zener diode is provided. Since with different loads, voltage peaks of different height are also to be permitted, it is provided, in accordance with another feature, that a limiting of the voltage at the semiconductor switch (2) is dependant on the switching voltage.

Another aspect of the invention contributes towards effecting an error diagnosis which is as informative as possible with the circuit of the invention by providing for each semiconductor switch (2) a short-circuit monitoring circuit (21-26) and a no-load monitoring circuit (13-19), each having an output connection (26, 18).

According to another feature of the invention, upon a pulsating control of the semiconductor switch (2), an output signal of the no load monitoring circuit (13-19) is produced, said signal assuming the value intended for indicating no-load operation if the current through the semiconductor switch (2) remains below a predetermined value during an entire conductive phase of the semiconductor switch (2).

Also according to a feature of the invention, the no-load monitoring circuit is formed by a first threshold value circuit (13), a first low pass filter (14) and a first flip-flop (15), and the short-circuit monitoring circuit is formed by a second threshold value circuit (21), a second low pass filter (22) and a second flip-flop (24).

Still further, the invention provides that the first flip-flop (15) can be reset by an output signal of the first low pass filter (14) and set by a pulse-like control signal fed to it, and that an output signal of the first flip-flop (15) is combined with the control signal to form a output signal of the no-load monitoring circuit.

Yet further according to a feature of the invention, the second flip-flop (24) can be set by the output signal of the second low pass filter (22), and is clocked by a pulse-like control signal fed to it. Also an output signal of the second flip-flop (24) forms the output signal of the short-circuit monitoring circuit.

Still further, the output signal of the second threshold value circuit (21) controls a feeding of the control signal to the control electrode of the semiconductor switch (2).

Also the invention provides that a further output signal of the second flip-flop (24) controls a feeding of the control signal to the control electrode of the semiconductor switch (2).

Still according to a feature of the invention, there is provided in the module (1) a temperature sensor (31) the output signal of which so controls the short-circuit monitoring circuits (21-26, 21'-26') that when a predetermined temperature is exceeded the outputs (26, 26') of the short-circuit monitoring circuits (21-26, 21'-26') give off the value intended for a short circuit.

Still with the invention, the semiconductor switch (2) is a multi-emitter transistor, one emitter being connected to ground and each of two further emitters being connected to an input of the short-circuit monitoring circuit (21-26) and an input of the no-load monitoring circuit (13-19).

BRIEF DESCRIPTION OF THE DRAWING

With the above and other objects and advantages in view, the present invention will become more clearly understood in connection with the detailed description of a preferred embodiment, when considered with the accompanying drawings, of which.

DETAILED DESCRIPTION OF A PREFERRED EMBODIMENT

Figure 1:
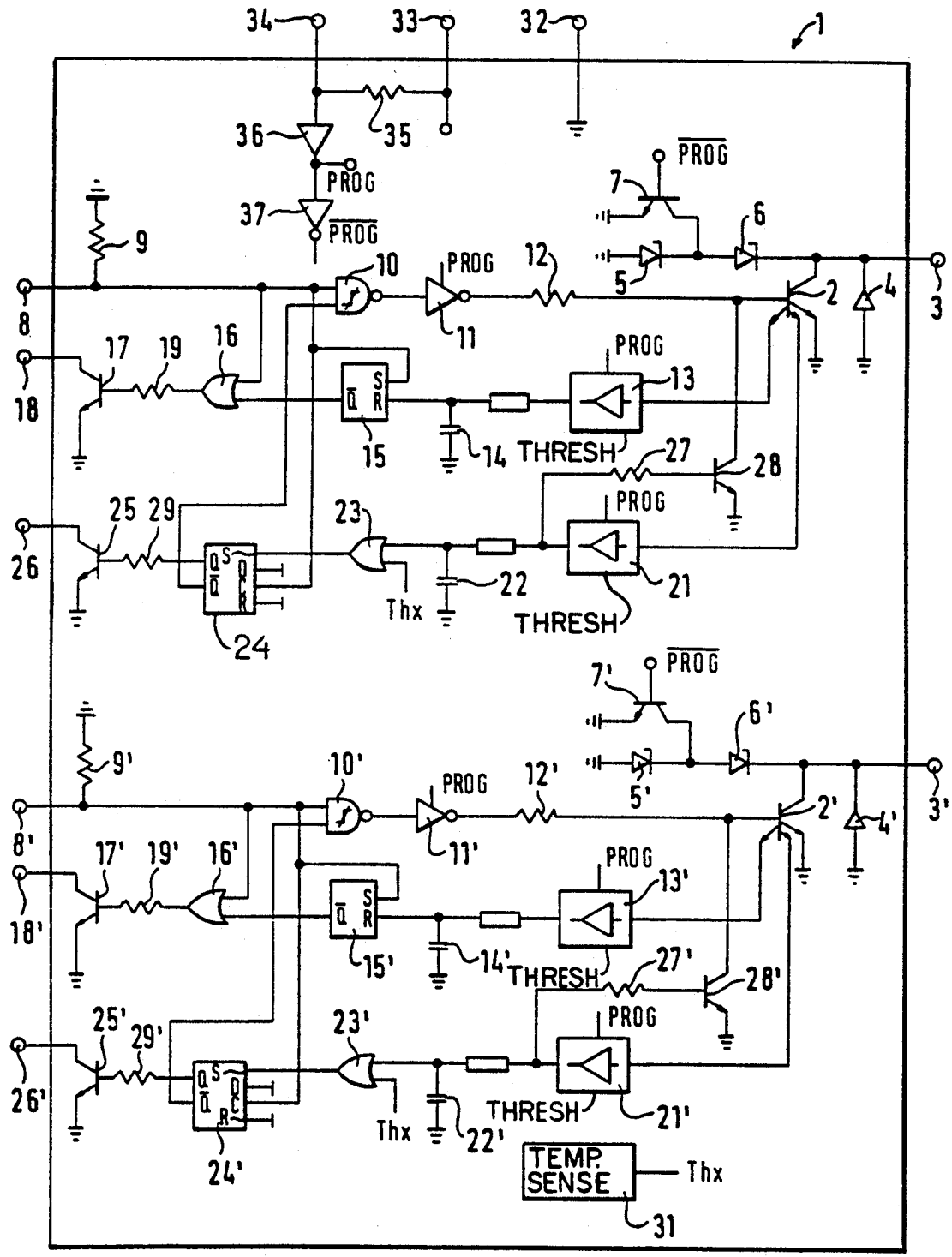
FIG. 1 is a block diagram of an embodiment of a circuit of the invention.

In the figures, identical parts have been provided with identical reference numerals. The module 1 shown in FIG. 1 contains two identical circuits, each having a semiconductor switch which is suitable as output stage (driver), for instance, for different setting members in a motor vehicle, and circuits associated with the semiconductor switch. In the following, therefore, only the circuit with the reference numbers 2-29 will be described, while the elements of the other circuit are provided with the reference numbers 2' to 29'.

The output stage is formed by a multi-emitter transistor 2, one emitter of which is connected to ground and the collector of which is connected to an output 3. Since the circuit is intended essentially for the switching of inductive loads, a reverse-polarity protection diode 4 and free-wheeling zener diodes 5, 6 are connected in parallel to the transistor 2, the series-connected zener diodes 5, 6 furthermore protecting the transistor 2 against overvoltage. By bridging the zener diode 5 by a transistor 7, the limiting voltage can be reduced.

A control signal for the transistor 2 is fed via an input 8 which is grounded via an input resistor 9. The control signal passes via a NAND circuit 10, an inverting amplifier 11 wherein the degree of amplification is adjustable, and a resistor 12 to the base of the transistor 2.

In order to recognize errors in the region of the output 3, a no-load monitoring circuit and a short-circuit monitoring circuit are provided. The no-load monitoring circuit responds when the current through the transistor 2 lies below a predetermined threshold and when therefore, there is an interruption in the line between the collector of the transistor 2, the load, within the load or between the load and the positive operating voltage. Furthermore, the no-load monitoring circuit responds when the output 3 is short-circuited to ground.

The short-circuit monitoring circuit responds when the current through the transistor 2 exceeds another predetermined value, as is essentially the case upon contact between the output 3 or the line to the load on the one hand and the positive pole of the source of operating voltage on the other hand.

The no-load monitoring circuit is formed by a threshold-value circuit 13, a low pass filter 14 (comprising a capacitor and a resistor), a flip-flop 15 an OR circuit 16 and an output transistor 17. From an output 18 there can be obtained a signal which indicates no-load operation and therefore, for instance, a break in the line.

The threshold-value circuit 13 produces an output signal which becomes positive when a predetermined value of the current through the transistor 2 is exceeded. This predetermined value lies below the current to be expected for the load in question, in which connection tolerances of the individual loads and variations in time and temperature are to be taken into consideration. Brief disturbances are suppressed by the low-pass filter 14 which has a time constant of, for instance, 200 μs.

The flip-flop 15 is set in each case upon the start of a control pulse which brings the transistor 2 into the conductive state. The value L (low voltage) is then at the output $\bar{Q}$. By means of the OR circuit 16 to the control signal which at this time has the value H, a positive signal (H) is also present at the output of the OR circuit 16, which signal brings the transistor 17 into conductive state via the resistor 19. The output 18 is thus imparted the level L.

If, during the conductive phase of the transistor 2, the current increases above the threshold value, as takes place upon disturbance-free operation also in the case of inductive loads, the flip-flop 15 is reset. At the end of the conductive phase, the control signal assumes a value L, so that, as a result of the OR connection at 16, the signal at the output 18 is dependent on the level at the output $\bar{Q}$. Since the flip-flop 15 has been reset, the level H is present at the output $\bar{Q}$ so that the transistor 17 continues to be conductive and the level L prevails at the output 18.

However, if the current through the transistor 2 has not exceeded the predetermined value during the conductive phase, then the flip-flop 15 remains set so that the output $\bar{Q}$ continues to have the level L. This leads to a blocking of the transistor 17 so that the level H at the output 18 is given off as error report.

The short-circuit monitoring circuit consists of a threshold value circuit 21, a low pass filter 22 (comprising a capacitor and a resistor), an OR circuit 23, a flip-flop 24 and an output transistor 25 the collector of which forms an output 26. The output signal of the threshold-value circuit 21 jumps to a positive value when the current through the transistor 2 exceeds a value which lies above the value of the currents to be expected in normal operation. The low pass filter 22 serves to suppress brief disturbances. In order to counteract an overload of the transistor 2 as rapidly as possible, the base of a transistor 28 is connected to the output of the threshold-value circuit 21 via a resistor 27, the transistor connecting the base of the transistor 2 to ground in the event of a short circuit, thus preventing further control. In this way, the current is limited to a value at which the transistor is still not overloaded and which is sufficient to set the flip-flop 24, which is clocked by the control signals.

By the setting of the flip-flop 24, the transistor 25, which is connected via a resistor 29 to the output Q of the flip-flop 24, becomes conductive, so that in the event of a short circuit the output 26 assumes the level L. At the same time, due to the connection of the output $\bar{Q}$ of the flip-flop 24 to the NAND circuit 10, further feeding of the control signals to the transistor 2 is interrupted until the control signal at the input 8 again changes from level L to level H and the flip-flop 24 is thus again reset.

The module 1 furthermore contains a temperature sensor 31 which gives off a signal Thx which assumes the level H when a permissible temperature value is exceeded. This signal is fed to the OR circuits 23, 23' and thus gives a short-circuit error report in both circuits. Since a simultaneous short circuit at both outputs 3, 3' is extremely improbable, a connected microcomputer can recognize from this that a thermal overload is, in all probability, present.

Via a connection 32, the module 1 can be connected to ground potential or to a negative terminal of the source of operating voltage. A connection 33 serves to feed the positive operating voltage. By means of another connection 34, the module can be switched for two different load ranges. The connection 34 is acted on by the positive operating voltage via a resistor 35.

If the module 1 is used in a control device with small loads, then the connection 34 is connected to ground potential. In control devices with large loads, the connection 34 remains without further connection. By means of a non-inverting amplifier 36, the switch voltage PROG fed at 34 is fed to a control input of the amplifier 11 and to control inputs of the threshold-value circuits 13, 21. Via an inverting amplifier 37, the inverted switch voltage PROG reaches the base of the transistor 7. By the control of the amplifier 11, it is possible to adapt the base current of the transistor 2 to the specific load and, therefore, to the maximum current. In this way, an unnecessarily high base current is avoided in the case of small loads. The control of the threshold-value circuits 13, 21 permits adaptation of the threshold values to the instantaneous loads present. The switching of the voltage limitation can be developed, for instance, in the manner that in the case of automotive fuel injection valves, which have a relatively high flashback voltage, the limiting takes place at 80 V and in the case of other loads it takes place at 27 V.

Figure 2:
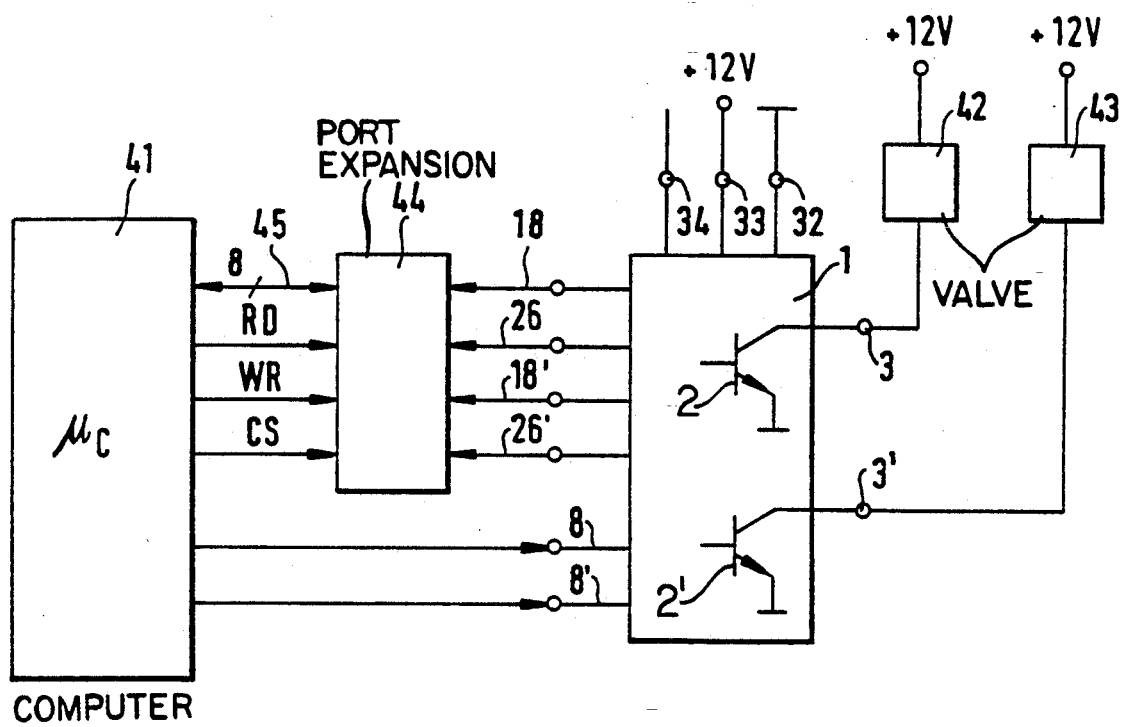
FIG. 2 is a block diagram of a control device having a circuit in accordance with the invention.

FIG. 2 shows parts of a control device with the use of the module of FIG. 1. Here, a microcomputer 41 is provided which produces control signals and feeds them via the inputs 8, 8' to the module 1. The outputs 3, 3' of the module are connected to injection valves 42, 43, to which a voltage of +12 V is furthermore fed. Via connections 33, 32 the module is connected to a source of operating voltage and to ground potential. In order to interrogate the error reports which, as described in connection with FIG. 1, are produced in the module 1, the outputs 18, 26, 18', 26' are connected to inputs of a port expansion 44. Via a data line 45 and corresponding control lines RD, WR and CS, the computer 4 examines the state of the outputs 18, 26, 18', 26'. Corresponding to a program entered in the computer 41, suitable steps can be taken if error reports are present.

We claim:

1. A switching arrangement, developed as a module, comprising
    a switch input, at least one semiconductor switch for different load ranges;
    a no-load monitoring circuit having a threshold circuit and an output terminal;
    a short-circuit monitoring circuit having a threshold circuit and an output terminal, each of the threshold circuits having a control input, the semiconductor switch having a control electrode, wherein
    the switch input of the module is connected with the control electrode of the semiconductor switch and to the control inputs of the threshold circuits for adaptation of circuitry of the switch and threshold values of the threshold circuits to a selected value of load range.

2. A switching arrangement according to claim 1, further comprising
    an amplifier providing current to the semiconductor switch for switching current to a load; and
    a non-inverting amplifier connecting the switch input to a control input of said amplifier.

3. A switching arrangement according to claim 2, further comprising a transistor having a collector connected to the semiconductor switch, and an inverting amplifier having an output terminal connected to a base of said transistor;
    wherein the switch input is connected via the non-inverting amplifier to the inverting amplifier.

4. A switching arrangement according to claim 1, wherein said short circuit monitoring circuit is for monitoring current in said semiconductor switch and said no-load monitoring circuit is for monitoring current in said switch.

5. A modular circuit according to claim 1, further comprising
    a second semiconductor switch, a further short-circuit monitoring circuit, and a further no-load monitoring circuit; and wherein
    each of said semiconductor switches is connected to a respective one of said short-circuit monitoring circuits and a respective one of said no-load monitoring circuits, each of said further monitoring circuits having an output terminal.

6. A modular circuit according to claim 1, wherein
    in said no-load monitoring, said threshold circuit comprises a first threshold value circuit, a first low pass filter and a first flip-flop; and
    in said short-circuit monitoring circuit, said threshold circuit comprises a second threshold value circuit, a second low pass filter, and a second flip-flop.

7. A modular circuit according to claim 6, wherein, in said no-load monitoring circuit,
    said first flip-flop is resetable by an output signal of said first low pass filter, and is set by a pulse-like control signal; and
    said semiconductor switch is responsive to a control signal;
    said no-load monitoring circuit includes means for combining an output signal of said first flip-flop with the control signal to form an output signal of the no-load monitoring circuit.

8. A modular circuit according to claim 6, wherein, in said short-circuit monitoring circuit,
    said second flip-flop is setable by an output signal of said second low pass filter, and is clocked by a pulse-like control signal; and
    an output signal of said second flip-flop serves as an output signal of said short-circuit monitoring circuit.

9. A modular circuit according to claim 8, wherein
    said semiconductor switch is responsive to said control signal;
    the output signal of said second threshold value circuit controls a feeding of the control signal to said control electrode of said semiconductor switch.

10. A modular circuit according to claim 8, wherein
    said semiconductor switch is responsive to said control signal;
    a further output signal of said second flip-flop controls a feeding of the control signal to said control electrode of said semiconductor switch.

11. A modular circuit according to claim 5, wherein said module encloses said monitoring circuits; and
    within said module, a temperature sensor which provides an output signal to control each of said short-circuit monitoring circuits such that, upon an exceeding of a predetermined temperature, each of said short-circuit monitoring circuits outputs a value of voltage indicating a short circuit at each of said semiconductor switches.

12. A modular circuit according to claim 1, wherein said semiconductor switch is a multi-emitter transistor, wherein one emitter is connected to ground and each of two further emitters are connected respectively to an input of said short-circuit monitoring circuit and an input of said no-load monitoring circuit.

13. A switching arrangement according to claim 1, further comprising
a first amplifier arranged in front of the semiconductor switch, said first amplifier having a control input,
a non-inverting amplifier, and
the switch input is connected via said non-inverting amplifier to said control input of said first amplifier.

14. A modular switching system comprising
a semiconductor switch providing a load current to a load, said load current flowing through said switch, the magnitude of the load current being dependent on an electric drive signal applied to a drive terminal of said switch;
means for monitoring said load current, said monitoring means including a high current threshold circuit and a low current threshold current for signaling values of load current in excess of the high current threshold and below the low current threshold, said threshold circuits being connected separately to said switch;
a drive circuit for supplying said drive signal to said drive terminal;
circuit means having a control terminal, said circuit means being operative to adjust values of said drive signal and said high current threshold and said low current threshold in response to a control signal applied to said control terminal for adapting operation of said system to a selected value of said load current.

* * * * *